United States Patent
Bruce et al.

(10) Patent No.: US 6,395,438 B1
(45) Date of Patent: May 28, 2002

(54) METHOD OF ETCH BIAS PROXIMITY CORRECTION

(75) Inventors: James A. Bruce, Williston; Orest Bula, Shelburne; Edward W. Conrad, Jeffersonville; William C. Leipold, Enosburg Falls, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/756,540

(22) Filed: Jan. 8, 2001

(51) Int. Cl.[7] .................................................. G03F 9/00
(52) U.S. Cl. ............................................. 430/30; 430/5
(58) Field of Search .............................. 430/5, 30, 313, 430/323

(56) References Cited

U.S. PATENT DOCUMENTS

| | | | |
|---|---|---|---|
| 5,553,274 A | 9/1996 | Liebmann | 395/500 |
| 5,705,301 A | 1/1998 | Garza et al. | 430/5 |
| 5,725,974 A | 3/1998 | Kawahira | 430/5 |
| 5,815,685 A | 9/1998 | Kamon | 395/500 |
| 5,879,844 A | 3/1999 | Yamamoto et al. | 430/30 |
| 6,033,814 A | 3/2000 | Burdorf et al. | 430/30 |

FOREIGN PATENT DOCUMENTS

WO  WO 99/14638  3/1999

*Primary Examiner*—Christopher G. Young
(74) *Attorney, Agent, or Firm*—Connolly Bove Lodge & Hutz; Richard M. Kotulak

(57) ABSTRACT

A method for including etch bias corrections in pre-processing of integrated circuit design data to compensate for deviations introduced during lithographic printing and etching. The design data is segmented, and etch bias corrections are applied to the segments based on their proximity to adjacent design features. Adjusted or corrected design data is produced which may be used to create a mask which includes etch bias corrections for better fidelity and reproduction of the original design in the etching step. Etch bias corrections may also be applied based upon characteristics of regions defined in the design, or on a pattern density of the design.

20 Claims, 8 Drawing Sheets

|  | COL. | 1 | 2 | 3 | 4 |
|---|---|---|---|---|---|
|  |  | 0.15 | 0.20 | 0.25 | 0.30 |
| 1 | 0.17 | 0.005 | 0.006 | 0.007 | 0.008 |
| 2 | 0.25 | 0.003 | 0.004 | 0.005 | 0.006 |
| 3 | 0.30 | 0.001 | 0.002 | 0.003 | 0.004 |
| 4 | 0.31 | 0.0 | 0.0 | 0.0 | 0.0 |

LINE WIDTHS IN μm →

LINE SPACES IN μm → ROW

METHOD OF ETCH BIAS PROXIMITY CORRECTION

BACKGROUND OF THE INVENTION

The present invention relates to lithographic printing of integrated circuit (IC) designs on semiconductor wafers, and more particularly to a method for manipulation of data describing a mask pattern to compensate for etch bias effects when the pattern is subsequently etched into a semiconductor wafer.

In lithographic printing, a mask containing an image of an IC design is interposed between a semiconductor wafer and an illumination source. Ultraviolet radiation of varying wavelengths is projected from the illumination source, through the mask and reduction lenses, and onto photoresist (resist) coating the wafer surface.

The mask defines areas where the radiation is blocked, and areas where it is allowed to pass through and form an exposure field on the resist. In areas where the resist is exposed, the solubility properties of the resist are changed. Effectively, the image of the design contained in the mask is transferred to the resist. The films under the resist may be subsequently etched away to effect a physical transfer of the design into the wafer.

For current semiconductor chip and lithography technologies, dimensions on the wafer are being printed that are shorter than the wavelength of the radiation used to print them. This causes deviations in the original design to be introduced by diffraction effects. Diffractions effects include, for example, corner rounding and line foreshortening. In corner rounding, shapes in the IC design which should have sharp, right-angled corners will acquire a certain non-zero radius of curvature when printed. Line foreshortening causes lines in the design to be printed with the incorrect length. Unwanted optical interactions referred to as proximity effects can also occur when shapes in a design are too close to each other.

Known techniques exist for pre-processing design data before it is transferred onto a mask for printing in order to compensate for the known optical effects described above. Optical proximity correction (OPC), for example, is a known computer-implemented process for compensating for optical effects by adjusting shapes in the design prior to lithographic printing to ensure that when printing is performed, undesirable optical effects are eliminated or within tolerable ranges.

However, there are other effects which can cause deviations in the transfer of a mask pattern onto a wafer which are not known to be accounted for by existing methods. For example, in reactive ion etching (RIE), an etch bias further introduces deviations in the original design due to the proximity of other shapes.

In view of the foregoing, a method is needed which accounts for local variations in the etch bias as well as optical proximity effects, in order to make a more thorough compensation to mask data and thus achieve a more accurate reproduction of the original design when the mask is printed and etched.

SUMMARY OF THE INVENTION

According to the present invention, design data is treated to correct for etch bias effects.

In an embodiment, shapes or image data of an integrated circuit design is processed to obtain a representation of the images in terms of line segments and associated spaces adjacent to the line segments.

Using an etch bias matrix which specifies, for a range of line widths and associated spaces, a compensating line edge adjustment, the line segments are shifted based on adjacent line segment proximity. Application of the adjustments provided by the etch bias matrix produces an adjusted or corrected design data set which includes the appropriate etch bias corrections for producing a more accurate etching result.

In another embodiment of the invention, characteristics of shapes data of an IC design are used to create region definitions in terms of selected characteristics. An etch bias is defined for each of the regions. A marker shape data set is then created for the IC design which partitions the IC design into sections corresponding to criteria associated with the different regions. The IC design is overlaid with the marker shapes, and the etch bias corresponding to each marker shape is applied to the edges of the design, to produce image data corrected for etch bias.

According to another embodiment of the invention, effects of etching are treated in a more global manner. A pattern density grid of an IC design is created, and an etch bias characteristic for each grid element is determined. The IC design is overlaid with the pattern density grid. Each edge of the design that falls within a particular grid element is corrected by the etch bias factor associated with that particular pattern density.

DETAILED DESCRIPTION OF THE INVENTION

Figure 1A:
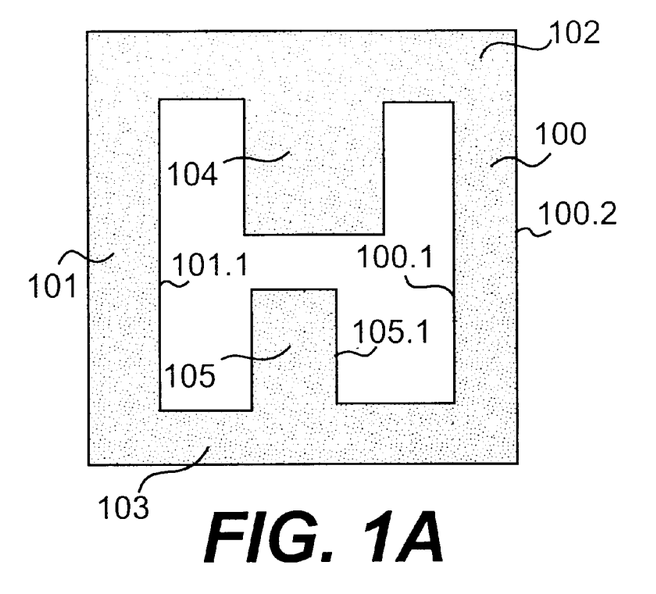
FIG. 1A shows an example of an original design element.

FIG. 1A shows an example of a possible shape of an IC design element, comprising lines enclosing a space having an "H"-like configuration. The lines comprise vertical sections 100 and 101, horizontal sections 102 and 103, downward protrusion 104 and upward protrusion 105.

Further, the enumerated sections have "edges." For example, vertical section 100 has a left edge 100.1 and a right edge 100.2. Similarly, vertical section 101 has a right edge 101.1. Upward protrusion 105 has a right edge 105.1. Thus, it may be readily perceived that FIG. 1A, and shapes data in general, may be referred to in terms of its constituent lines, spaces and edges.

FIG. 1A represents original image (shapes) design data produced, for example, by a CAD (Computer-Assisted Design) process. More particularly, FIG. 1A corresponds to digital data which is capable of being interpreted by suitable software to produce a visual image displayable on a computer screen, for example, or to graphically record the image as a mask. The digital data may be expressed in a known graphics language such as GL1.

Figure 1B:
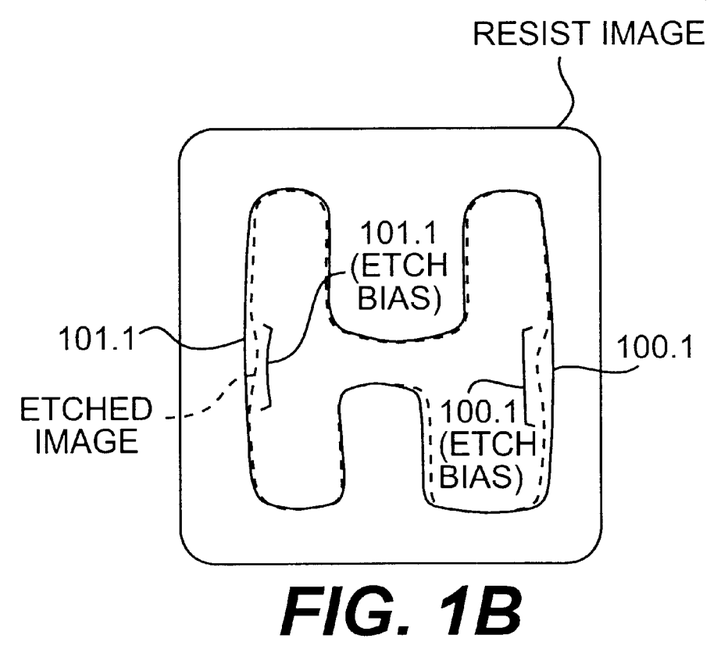
FIGS. 1B and 1C show the element of FIG. 1A with simulated or predicted deviations introduced by printing and etching.
Figure 1C:
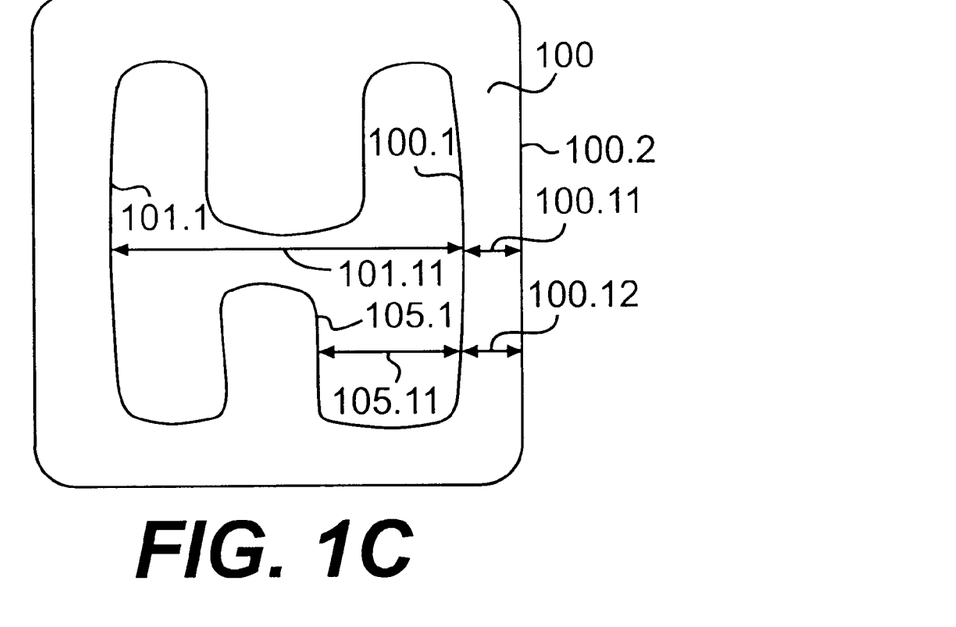
Figure 1D:
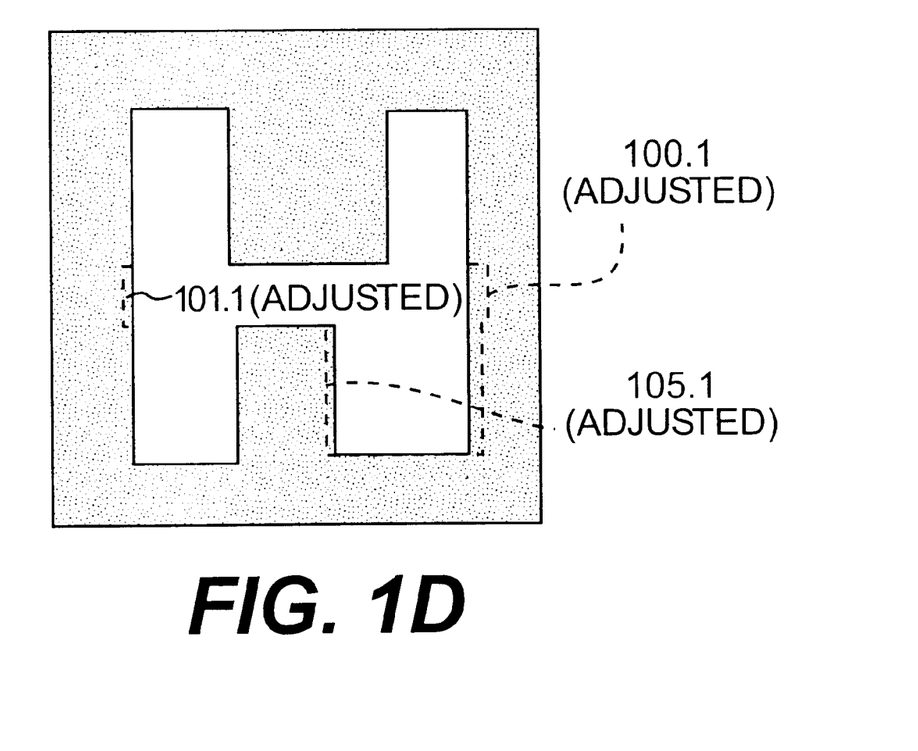
FIG. 1D shows the design element of FIG. 1A with corrected edges according to the invention.

FIG. 1D represents the original shapes data of FIG. 1A after having been processed according to the present invention to compensate for etch bias. In FIG. 1D, the broken lines represent shifts in the original edge placements. For example, the broken line designated 100.1 (adjusted) represents a rightward shift in original edge 100.1 to compensate for etch bias. Similarly, the broken lines designated 101.1 (adjusted) and 105.1 (adjusted) represent leftward shifts in original edges 101.1 and 105.1, respectively.

Figure 2A:
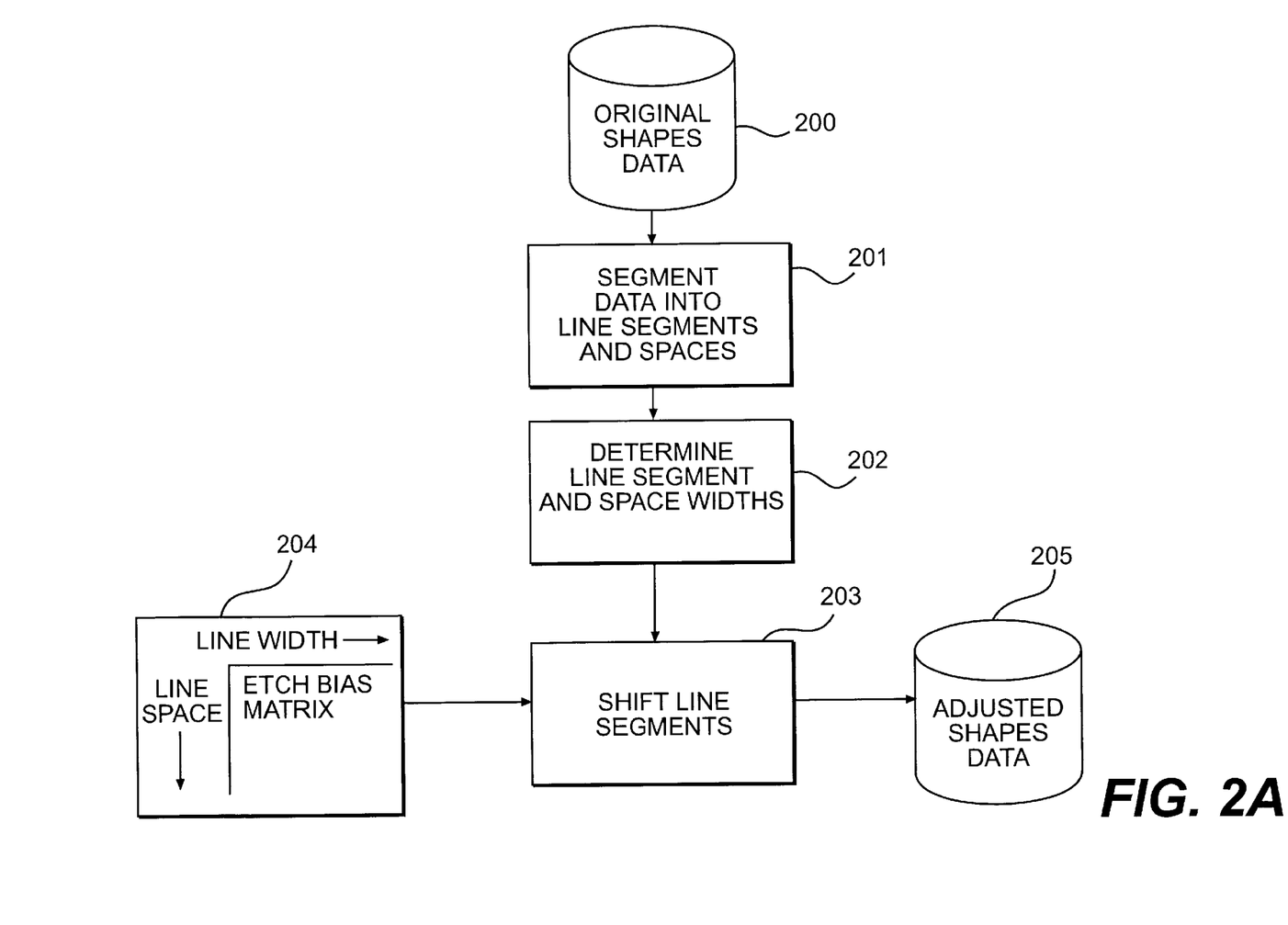
FIG. 2A shows a processing flow according to the invention, for processing data as shown, for example, in FIG. 1A.

FIG. 2A shows a process flow for applying the method of the invention, to generate original shapes data adjusted for etch bias as shown in FIG. 1D. An original design shapes data set 200 is provided. The shapes data set describes an IC design in terms of original data such as illustrated in FIG. 1A.

The image data is processed to segment or break down the image, i.e., characterize the image in terms of line segments and spaces between the line segments and neighboring features, as shown in block 201. Then the width of each line segment and associated space is determined as shown in block 202 of FIG. 2A.

As shown in block 204, an etch bias matrix is provided The etch bias matrix supplies a corrective parameter to each line segment generated in step 202 which specifies an amount by which to shift the line segment to compensate for etch bias.

As shown in block 204, the etch bias matrix correlates a corrective or adjustment value with pairs of line segment widths and associated spaces to neighboring features. The etch bias matrix corrective values essentially constitute a prediction of how much deviation will be introduced into the original pattern by etching. The corrective values of the matrix accordingly adjust the original data to compensate for the predicted deviation.

Figure 2B:
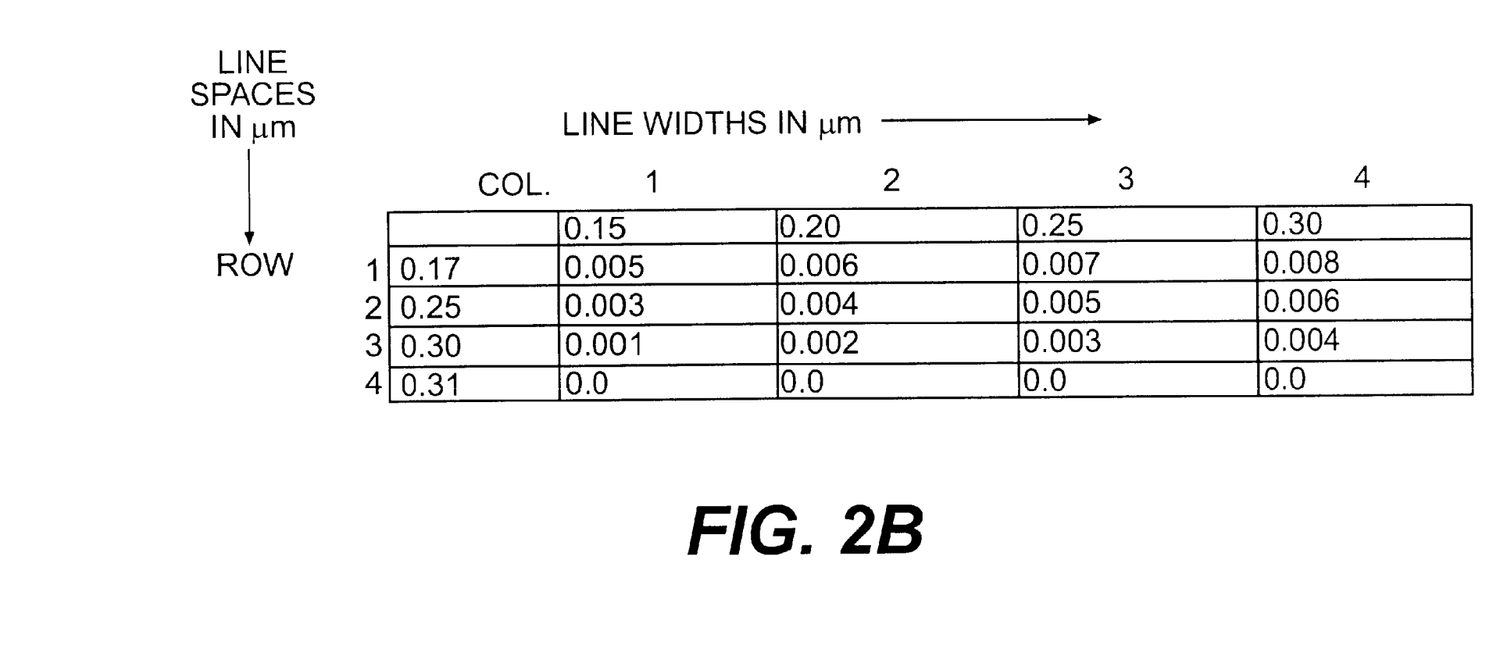
FIG. 2B shows example entries in an etch bias matrix according to the invention.

FIG. 2B shows an example of a portion of an etch bias matrix. For example, the entry in col. 1, row 1 of the matrix specifies a corrective shift of 0.005 im for a line segment width of 0.15 im and space to a closest neighboring segment of 0.17 im. Similarly, the entry in col. 2, row 1 of the matrix specifies a corrective shift of 0.006 im for a line segment width of 0.20 im and space to a neighboring segment of 0.17 im. The direction of the shift is not shown, but may be provided in supplemental information.

The data in the edge bias matrix could be derived empirically, for example, by creating a test mask including lines of varying widths separated by spaces which would correspondingly vary with the line widths. The range of line widths and associated spaces would encompass those that would be encountered in the original design data. The test mask would be used to print the test pattern on a wafer, and the wafer would subsequently be etched. The dimensions of the etched images would be measured and recorded. The difference between the original test pattern dimensions and the etched dimensions would supply the etch bias data for the matrix.

As shown in block 203, using the etch bias matrix, the line segments are shifted based on the proximity of adjacent line segments to create an adjusted or corrected original shapes data set, shown in block 205. The adjusted shapes data set would then be supplied to a mask-building process which would incorporate the etch bias adjustments provided by the invention to produce better fidelity to the original design in the subsequent printing and etching phases.

Optionally, etch bias corrections may be applied to the original shapes data using simulated resist image data as a basis for performing look-ups of correction values in the etch bias matrix. Such an approach would comprise the step of (1) using simulation to generate simulated resist image data from original shapes data. The simulated resist image data predicts what the original design shapes would look like once printed in resist.

Then, (2) corrections to the original shapes data would be applied based on the simulated resist data, to compensate for deviations introduced in the simulated resist data. Steps (1) and (2) can be implemented by any number of known methods, such as OPC as described above.

Next (3) an additional correction to the original shapes data is applied, to compensate for etch bias. In this step, the simulated resist image data would be used to perform look-ups in the etch bias matrix, to determine what additional corrections to apply to the corresponding original shapes data.

For example, a given original design might include a line which was 0.2 im wide, spaced by 0.5 im from a neighboring line. In a simulated resist image corresponding to the given original design, the corresponding line might be 0.25 im wide. According to step (3), the 0.25 im value is used to perform a look-up in the etch bias matrix to find a correction to be applied, and (4) the correction is applied to the corresponding 0.2 im wide line in the original design data (in addition to the correction applied in steps (1) and (2)).

FIGS. 1B and 1C illustrate the foregoing. FIG. 1B represents an altered version of FIG. 1A such as it might appear after printing and etching. The solid lines in FIG. 1B represent a simulated resist image, i.e., edges as they might appear following printing in resist as described above, while broken lines correspond to further deviations which would subsequently be introduced by etching. It is noted that the broken line corresponding to predicted or simulated edge 101.1 has a pronounced rightward bulge, labeled 101.1 (etch bias), while the broken line corresponding to predicted or simulated edge 100.1 has a pronounced leftward bulge, labeled 100.1 (etch bias).

FIG. 1C shows some exemplary segments and spaces which would be used to perform look-ups in the etch bias matrix. Line segments 101.11 and 100.12 are between edges 100.1 and 100.2 of vertical section 100. Space 105.11 is between edge 105.1 of upward protrusion 105 and edge 100.1 of vertical section 100. Space 101.11 is between edges 101.1 and 100.1.

As described above, for each of line segments 100.11 and 100.12 and their associated spaces 101.11 and 105.11, respectively, to the closest neighboring features, an etch bias correction is looked up in the etch bias matrix and applied to a corresponding segment of the original design data already corrected for printing deviations. The printing corrections plus etch bias corrections are indicated by the broken lines in FIG. 1D. It may be noted that edge 101.1 (adjusted) has a portion displaced to the left, to compensate for the rightward bulge shown in FIG. 1B. Similarly, edge 100.1 (adjusted) has a portion displaced to the right, to compensate for the leftward bulge shown in FIG. 1B.

Advantages offered by applying corrections based on simulated resist image data as in steps (3) and (4) described above include that these steps can be readily applied with existing methods such as OPC. Moreover, because the etch bias is dependent on the end result of the printing process, i.e., the resist image, but not on the process of creating the resist image, steps (3) and (4) do not need to change with changes in the printing process. For example, changes in the illumination conditions of the printing process might require adjustment in steps (1) and (2) if performed, for example, by OPC, but the etch bias correction matrix applied in steps (3) and (4) would not need to change.

Additionally, by correcting after resist simulations, the pattern is closer to the final pattern, so better prediction of line/space values is possible.

Figure 3:
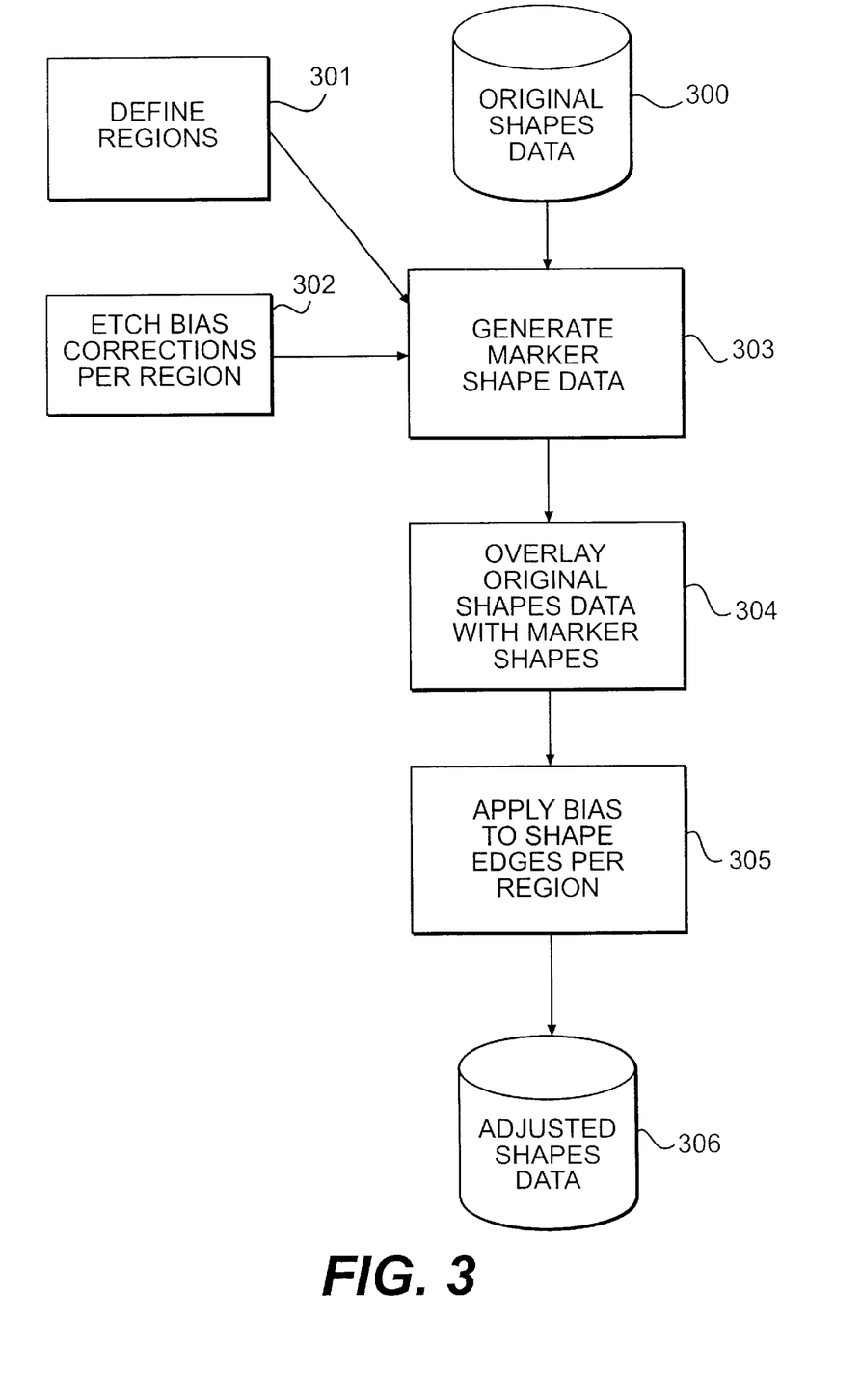
FIG. 3 shows another process flow according to the invention.

FIG. 3 illustrates a process flow according to another embodiment of the invention, as described above. As shown in FIG. 3, an original design shapes data set 300 is processed to generate a marker shape data set as shown in block 303.

To generate marker shapes, region definitions according to the invention are utilized as shown in block 301. Regions may be defined according to a variety of criteria, depending upon which is most suitable for the design data being processed. For example, regions might be defined in terms of minimum dimensions in the design, geometries of the design such as whether multiple corners are present or only parallel lines with single corners, or regions exhibiting none of the foregoing characteristics. The magnitude of the area associated with a region could also be a criterion in a region definition. Essentially, region definitions could be made as discriminating as desired by increasing the number of characteristics that would need to be exhibited by a portion of the design in order to meet a region definition.

Etch bias corrections per region are further supplied as shown in block 302. The etch bias correction per region could be derived, for example, experimentally by observing and measuring the degree of bias typically exhibited by a region having given characteristics.

As shown in block 304, the original shapes data is overlaid with the marker shapes generated in block 303. As used herein, "overlay" or "overlaying" refers to creating multiple "layers" within one data set. For example, the original design data could be defined as layer 0, the marker shape data for region 1 defined as layer 1, the marker shape data for region 2 defined as layer 2, and so on. The layered data set can then be analyzed and processed using data manipulation operations available in known graphics software, for example, Calibre ® software available from the Mentor Graphics Corporation. The data manipulation operations can determine the intersections, for example, of layer 0 with the other layers (i.e., the shapes or portions of shapes in layer 0 that fall within layer 1 (or 2, 3 . . . )), assign the intersections to a new layer name/number (e.g. layer 1a (or 2a, 3a . . . )), and selectively move edges in the new layer name/number by the amount determined for the corresponding region.

The marker shapes define regions with their associated etch bias correction factors. Next, as shown in block 305, the bias for each region is applied to shape edges of the original shapes data, and an adjusted or corrected shapes data set is produced as shown in block 306 which may subsequently be used to produce a mask including etch bias corrections.

Figure 4:
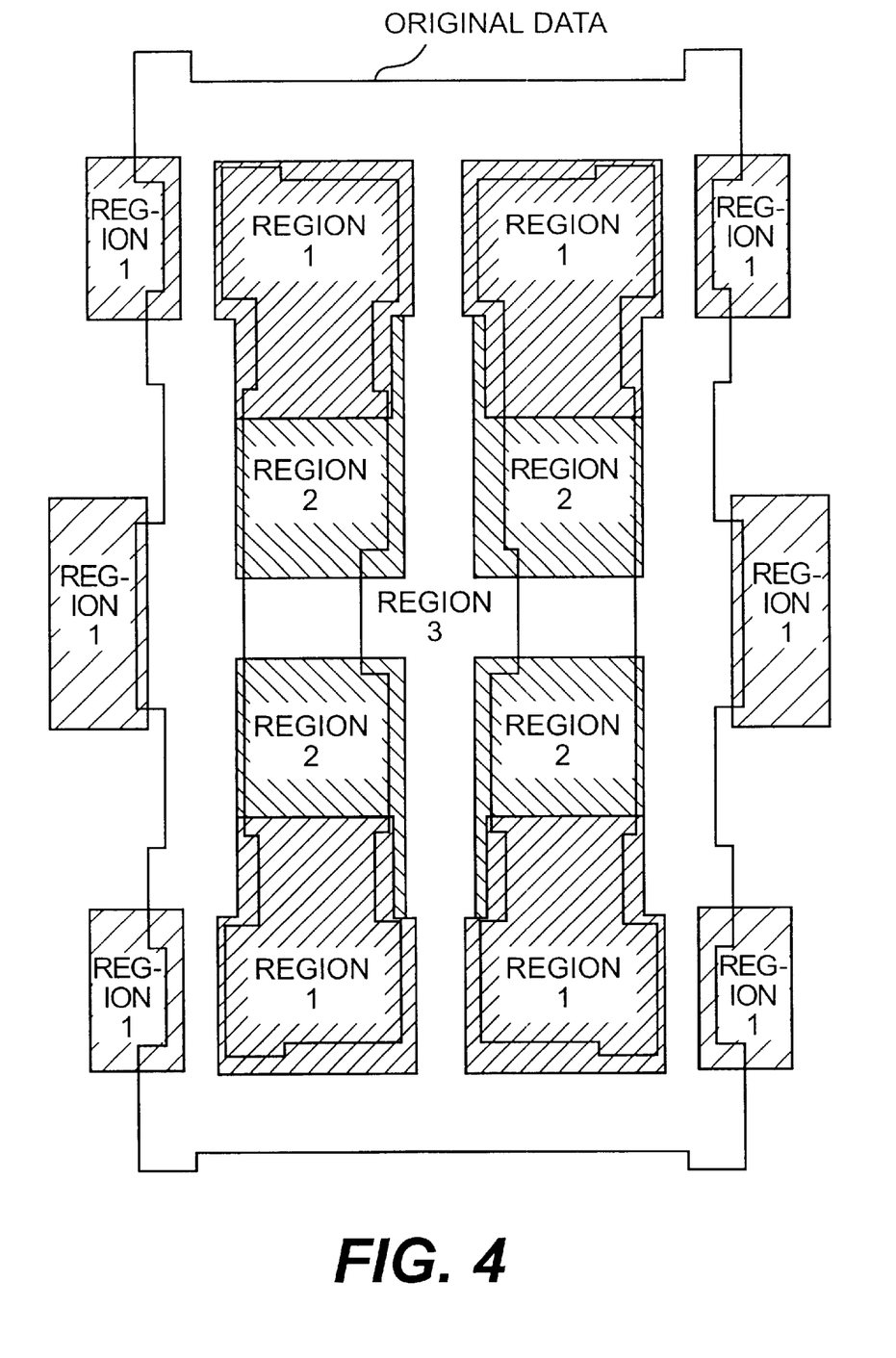
FIG. 4 shows design data overlaid with marker shapes, as an example of the application of the process flow illustrated in FIG. 3.

FIG. 4 shows an example of an application of the method using marker shapes. In FIG. 4 the original design data is indicated by the bold outlines having sharp angles.

Overlaying the data are the marker shapes. Three distinct types of regions delineated by the marker shapes are shown; regions of type 1, regions of type 2 and a region of type 3. Regions of type 1 and 2 are indicated by cross hatching in different directions, while region 3 has no cross hatching. It can be seen that region 1 is characterized by shapes in the original design data having at least two corners and forming a U-shape, while region 2 is characterized by parallel lines including only 1 corner. Region 3 encompasses those portions of the design data not matching the criteria for regions 1 and 2, or perhaps would receive no correction.

Additional examples of criteria that could be used to define the marker shape regions include: 1) the area of an enclosed block of resist (i.e., whether the area is greater than/less than pre-determined values, or within defined upper and lower bounds); 2) the area of a hole in resist; 3) the width of a space in resist; 4) the width of a resist line; 5) regions containing a corner, and 6) regions containing two corners separated by less than a certain distance. The foregoing list is not exhaustive and many additional or alternative criteria could be contemplated and are within the scope of the invention.

Although the etch bias corrections are not shown in FIG. 4, application of the etch bias correction defined for each region would result in moving edges passing through each region in accordance with its associated etch bias. The usage of region definitions offers an alternative to the segment-by-segment method described in connection with FIGS. 2A–2B, since the same etch bias is applied to each edge in a region.

It is further noted that simulated resist images could be used as a basis for determining which etch bias corrections to apply, as discussed above. The simulated resist images would be generated from the original design data, and marker shapes would be established based on characteristics of the simulated resist images. The marker shapes would then be overlaid on the original design data and corrections applied.

In another embodiment according to the invention, global effects of etching are accounted for to apply etch bias correction based on the pattern density of the design data. The approach recognizes that the chemical phenomena that occur during etching are related to the pattern density. For example, when etching relatively isolated resist structures, reactions of the gas species with the resist to produce new gas species has little effect in altering overall gas composition. However, in regions crowded with resist structures the gas composition is affected by reactions with the resist. The foregoing results in a different etch bias characteristic depending on the pattern density of a given area of the design.

Figure 5:
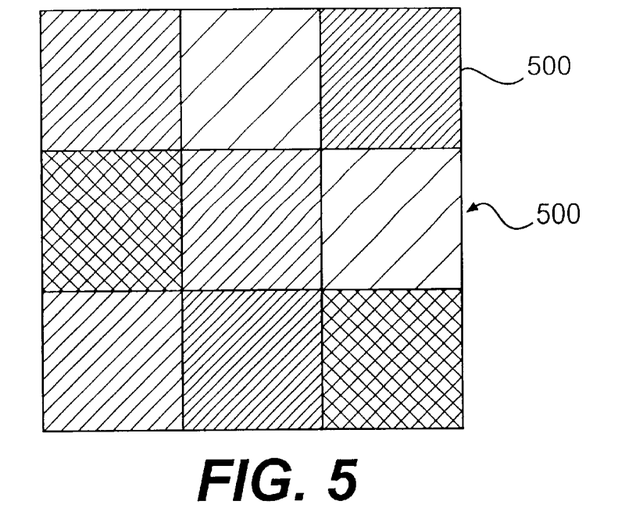
FIG. 5 shows a pattern density grid of a design layout.

FIG. 5 represents a pattern density grid comprising grid elements 500. The grid characterizes a portion of design data in terms of the density of resist features in the design pattern. Density might be defined in terms, for example, of a percentage of area of the grid elements which is filled with design features. In FIG. 5, areas of thicker cross hatching represent areas of the design where features are more thickly clustered, i.e., there is a higher fill percentage, while areas of less cross hatching indicate areas where features are more isolated, i.e., there is a lower fill percentage. The grid structure utilized by the invention may not necessarily be uniform as shown in FIG. 5.

Figure 6:
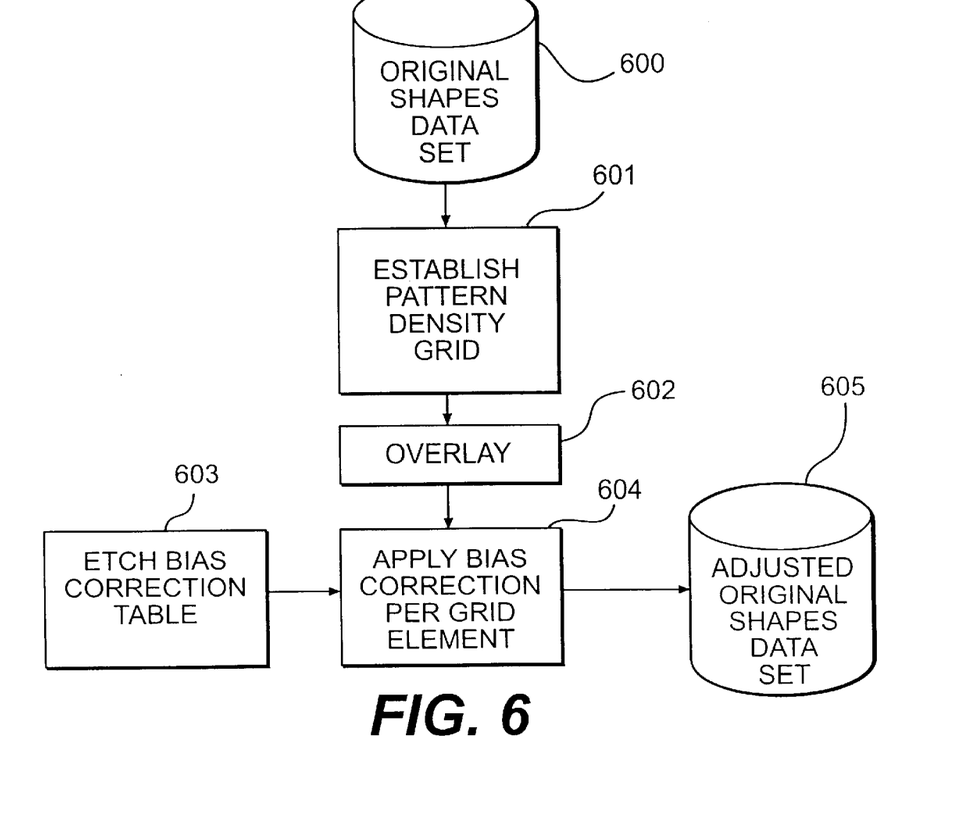
FIG. 6 shows a process flow according to the invention corresponding to FIG. 5.

Referring now to FIG. 6, an original shapes data set 600 describing a design would be processed to establish a pattern density grid corresponding to the design as shown in block 601.

The pattern density grid would be overlaid on the original shapes data as shown in block 602. An etch bias correction table 603, containing corrections based on the characteristic etch bias per grid element would be applied as shown in block 604, to shift edges passing through each grid element by the corresponding corrective amount. An adjusted or corrected original shapes data set 605 would be produced and applied to a mask.

It is further noted that, similarly to the above-described embodiments, simulated resist images could be used as a basis for establishing pattern density grids.

In a preferred embodiment, the invention is implemented as computer-executable instructions which when executed perform the steps of the method. The instructions are tangibly embodied in a program module or modules stored on computer-usable media.

Figure 7:
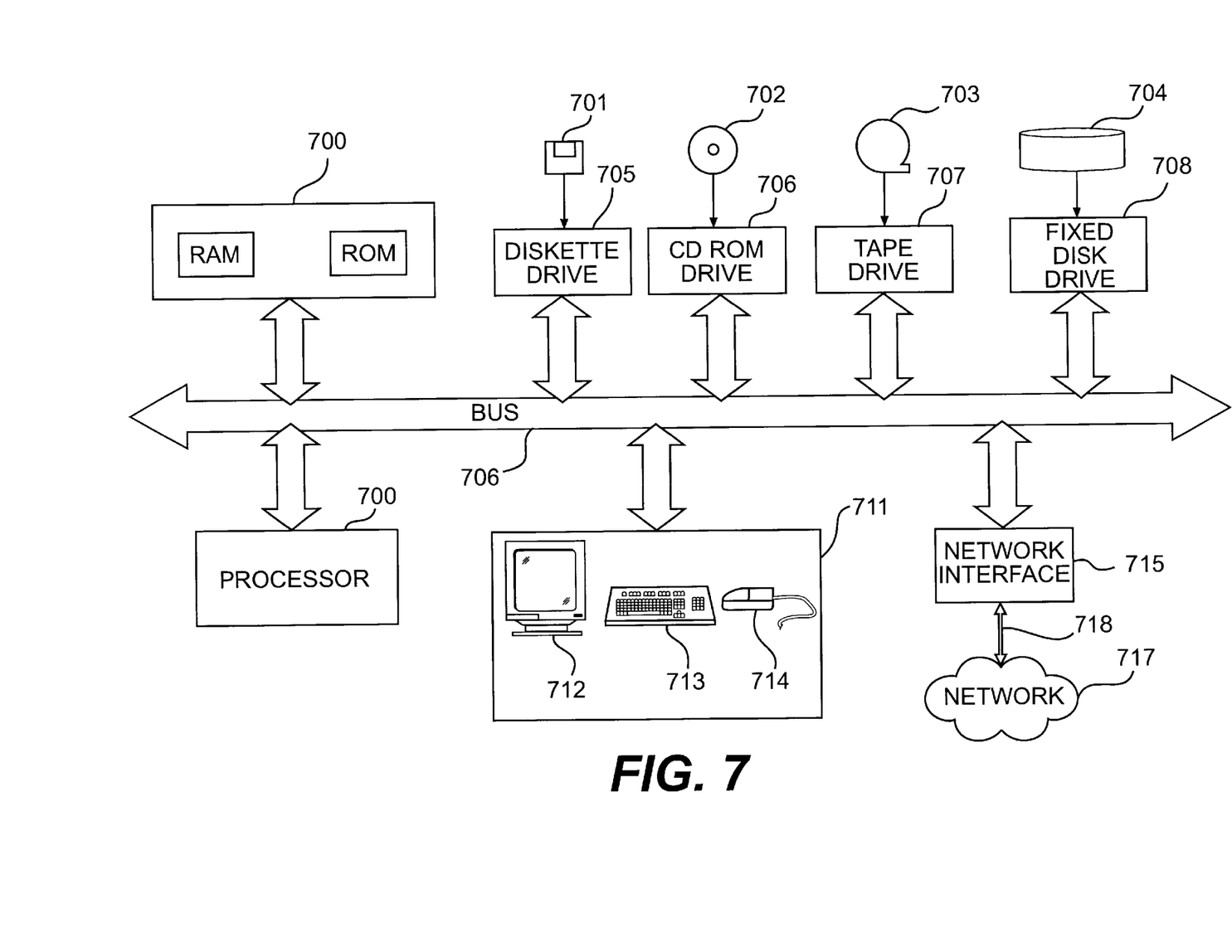
FIG. 7 shows a general purpose computer system for implementing an embodiment of the invention.

FIG. 7 shows a high-level representation of a general purpose computer system for implementing an embodiment of the invention in the form of computer-executable instructions, such as might be realized by a variety of known and commercially available hardware and software elements. The system comprises a memory 700 including a ROM and RAM, processor 710 and user interface 711 comprising a video display 712, keyboard 713 and mouse 714. Elements may communicate via system bus 706. The system may further be connected to a network 717 via a network medium 718 and network interface 715.

A computer program or a collection of programs comprising computer-executable instructions for performing method steps according to the present invention may be stored and transported on computer-usable media such as diskette 701, CD-ROM 702, magnetic tape 703 and fixed disk 704. To perform the steps of the method, the instructions may be retrieved from the computer-usable media 701–704 using their respective drives 705–708 into memory 700 and executed by a processor 710. The method disclosed hereinabove may find specific implementations in a variety of programming structures and data forms, which are considered to be within the abilities of a programmer of ordinary skill in the art after having reviewed the specification.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teaching and/or the skill or knowledge of the relevant art. The embodiment described hereinabove are further intended to explain best modes known of practicing the invention and to enable others skilled in the art to utilize the invention as such, or other, embodiments as with the various modifications required by the particular applications or uses of the invention. Accordingly, the description is not intended to limit the invention to the form disclosed herein. Also, it is intended that the appended claims be construed to include alternative embodiments.

What is claimed is:

1. A method of etch-biasing of masks, comprising the steps of:
   characterizing mask design data in terms of line segments and spaces to adjacent features;
   providing an etch bias matrix comprising entries specifying a corrective shift depending on a line segment width and associated space to adjacent features;
   shifting said line segments based on said etch bias matrix to produce adjusted mask design data; and
   applying said adjusted design data to a mask.

2. The method of claim 1, further comprising generating predicted resist image data from said mask design data and applying said corrective shift based on said predicted resist image data.

3. A method of etch-biasing of masks, comprising the steps of:
   generating a set of marker shapes corresponding to IC design data, said marker shapes based on region definitions in said design;
   overlaying said design data set with said marker shapes;
   moving line edges in said design data based on the marker shape the edges pass through to form adjusted design data; and
   generating a mask using the adjusted design data formed after the edges have been moved.

4. The method of claim 3, wherein said region definitions correspond to characteristic geometries of shapes in said design data.

5. The method of claim 4, wherein said region definitions correspond to a characteristic etch bias for said geometries.

6. The method of claim 3, further comprising generating predicted resist image data from said design data and generating said marker shapes based on said predicted resist image data.

7. A method of etch-biasing of masks, comprising the steps of:
   establishing a pattern density grid corresponding to IC design data;
   determining an etch bias associated with each density of said pattern density grid;
   overlaying said design data with said pattern density grid; and
   applying an etch bias correction to edges of said design data corresponding to the grid element the edges pass through.

8. The method of claim 7, wherein said pattern density relates to a fill percentage of resist features per grid element area.

9. The method of claim 7, further comprising generating predicted resist image data from said design data and applying said etch bias correction based on said predicted resist image data.

10. A method comprising:
    providing IC design shapes data;
    segmenting said shapes data into line segments and adjacent spaces;
    applying an etch bias correction to each of said segments based on its width and proximity to adjacent segments, to generate adjusted shapes data; and
    supplying said adjusted shapes data to a mask-building process.

11. The method of claim 10, further including providing an etch bias matrix for applying said correction, said matrix comprising data characterizing an etch bias associated with a range of line widths and adjacent spaces.

12. The method of claim 10, wherein said etch bias corresponds to a difference between said shapes data and an etched image.

13. The method of claim 10, further comprising generating predicted resist image data from said shapes data and applying said etch bias correction based on said predicted resist image data.

14. A method comprising:
    defining regions in an IC design according to selected criteria relating to a characteristic etch bias exhibited by said regions;

generating marker shapes corresponding to said regions;

overlaying said IC design with said marker shapes; and applying an etch bias correction to edges covered by said marker shapes in accordance with the characteristic etch bias of each marker shape.

15. A method comprising:

determining a pattern density grid corresponding to an IC design;

determining a characteristic etch bias per grid element;

overlaying said IC design with said pattern density grid; and applying an etch bias correction per grid element based on said characteristic etch bias.

16. A program storage device readable by a machine, tangibly embodying a program of instructions executable by the machine to perform method steps comprising:

characterizing mask design data in terms of line segments and spaces to adjacent features;

providing an etch bias matrix comprising entries specifying a corrective shift depending on a line segment width and associated space to adjacent features;

shifting said line segments based on said etch bias matrix to produce adjusted mask design data; and applying said adjusted design data to a mask.

17. The program storage device of claim 16, said method steps further comprising generating predicted resist image data from said mask design data and applying said corrective shift based on said predicted resist image data.

18. A computer-usable medium storing computer-executable instructions, said instructions when executed implementing a process comprising:

generating a set of marker shapes corresponding to IC design data, said marker shapes based on region definitions in said design;

overlaying said design data set with said marker shapes;

moving line edges in said design data based on the marker shape the edges pass through to form adjusted design data; and generating a mask using the adjusted design data formed after the edges have been moved.

19. The computer-usable medium of claim 18, said process further comprising generating predicted resist image data from said design data and generating said marker shapes based on said predicted resist image data.

20. A computer-usable medium storing computer-executable instructions, said instructions when executed implementing a process comprising:

establishing a pattern density grid corresponding to IC design data;

determining an etch bias associated with each density of said pattern density grid;

overlaying said design data with said pattern density grid; and applying an etch bias correction to edges of said design data corresponding to the grid element the edges pass through.

* * * * *